US011476207B2

(12) United States Patent
Lee et al.

(10) Patent No.: US 11,476,207 B2
(45) Date of Patent: Oct. 18, 2022

(54) SEMICONDUCTOR DEVICE STRUCTURE COMPRISING SOURCE AND DRAIN PROTECTIVE CIRCUITS AGAINST ELECTROSTATIC DISCHARGE (ESD)

(71) Applicant: Vanguard International Semiconductor Corporation, Hsinchu (TW)

(72) Inventors: Jian-Hsing Lee, Puzih (TW); Shao-Chang Huang, Hsinchu (TW); Chih-Hsuan Lin, Hsinchu (TW); Yu-Kai Wang, Hsinchu (TW); Karuna Nidhi, Bihar (IN); Hwa-Chyi Chiou, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 286 days.

(21) Appl. No.: 16/661,377

(22) Filed: Oct. 23, 2019

(65) Prior Publication Data
US 2021/0125943 A1    Apr. 29, 2021

(51) Int. Cl.
*H01L 23/60*    (2006.01)
*H01L 29/417*   (2006.01)

(52) U.S. Cl.
CPC ........ *H01L 23/60* (2013.01); *H01L 29/41725* (2013.01)

(58) Field of Classification Search
None
See application file for complete search history.

(56) References Cited

U.S. PATENT DOCUMENTS

2012/0037965 A1* 2/2012 Terada ............... G02F 1/13439
257/288

FOREIGN PATENT DOCUMENTS

TW    200849596 A    12/2008
TW    201426909 A    7/2014
TW    201740536 A    11/2017

OTHER PUBLICATIONS

Taiwanese Office Action and Search Report for Taiwanese Application No. 108115496, dated Jan. 16, 2020.

* cited by examiner

*Primary Examiner* — Daniel Whalen
(74) *Attorney, Agent, or Firm* — Birch, Stewart, Kolasch & Birch, LLP (57) ABSTRACT

A semiconductor device structure is provided. The semiconductor device structure includes a semiconductor substrate and a gate disposed on the semiconductor substrate. The semiconductor device structure also includes a source doped region and a drain doped region on two opposite sides of the gate. The semiconductor device structure further includes a source protective circuit and a drain protective circuit. From a side perspective view, a first drain conductive element of the source protective circuit partially overlaps a first source conductive element of the drain protective circuit.

8 Claims, 11 Drawing Sheets

SEMICONDUCTOR DEVICE STRUCTURE COMPRISING SOURCE AND DRAIN PROTECTIVE CIRCUITS AGAINST ELECTROSTATIC DISCHARGE (ESD)

BACKGROUND OF THE INVENTION

Field of the Invention

The present invention relates to a semiconductor device structure, and in particular to a semiconductor device structure including a static electricity protective circuit.

Description of the Related Art

Since the gate oxide structure of a transistor is closer to the drain region than the source and body regions, resulting in an electronic static discharge (ESD), traditional semiconductor devices can easily become damaged by the high voltage of an ESD. When ESD current flows from the source region, energy tends to be distributed to a gate dielectric layer rather than to the source/drain doped regions. As a result, the gate dielectric layer is permanently zapped.

In a traditional semiconductor device, additional elements are often used to prevent the transistor from being zapped. However, these additional elements occupy space in the whole integrated circuit as well as making the process harder and causing the cost to go up; therefore, it is necessary to develop a new semiconductor device structure that has good protection against ESD.

BRIEF SUMMARY OF THE INVENTION

The disclosure provides a semiconductor device structure. The semiconductor device structure includes a semiconductor substrate and a gate disposed on the semiconductor substrate. The semiconductor device structure also includes a source doped region disposed in the semiconductor substrate and a drain doped region disposed in the semiconductor substrate. The source doped region and the drain doped region are located on two opposite sides of the gate. The semiconductor device structure further includes a source protective circuit that comprises a plurality of source contact windows disposed on the source doped region and a plurality of first source conductive elements disposed on the source contact windows. Every first source conductive element is electrically connected to at least one source contact window. In addition, the semiconductor device structure includes a drain protective circuit that comprises a plurality of drain contact windows disposed on the drain doped region and a plurality of first drain conductive elements disposed on the drain contact windows. Every first drain conductive element is electrically connected to at least one drain contact window. From a side perspective view, the first drain conductive elements partially overlap the first source conductive elements.

The disclosure provides a semiconductor device structure. The semiconductor device structure includes a semiconductor substrate and a gate disposed on the semiconductor substrate and extending in a first direction. The semiconductor device structure also includes a source doped region disposed in the semiconductor substrate and extending in the first direction and a drain doped region disposed in the semiconductor substrate and extending in the first direction. The source doped region and the drain doped region are located on two opposite sides of the gate. The semiconductor device structure further includes a plurality of source contact windows disposed on the source doped region and extending in the first direction and a plurality of drain contact windows disposed on the drain doped region and extending in the first direction. In addition, the semiconductor device structure includes a first source conductive element disposed on the source contact windows. The first source conductive element is electrically connected to the source doped region and extends in the first direction.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The semiconductor device structure of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be noted that the present disclosure presents embodiments of a semiconductor device structure, and may be included in an integrated circuit (IC) such as a microprocessor, memory device, and/or another IC. The IC may also include various passive and active microelectronic devices, such as thin film resistors, other capacitors (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize other embodiments of semiconductor devices that may benefit from aspects of the present disclosure.

Figure 1:
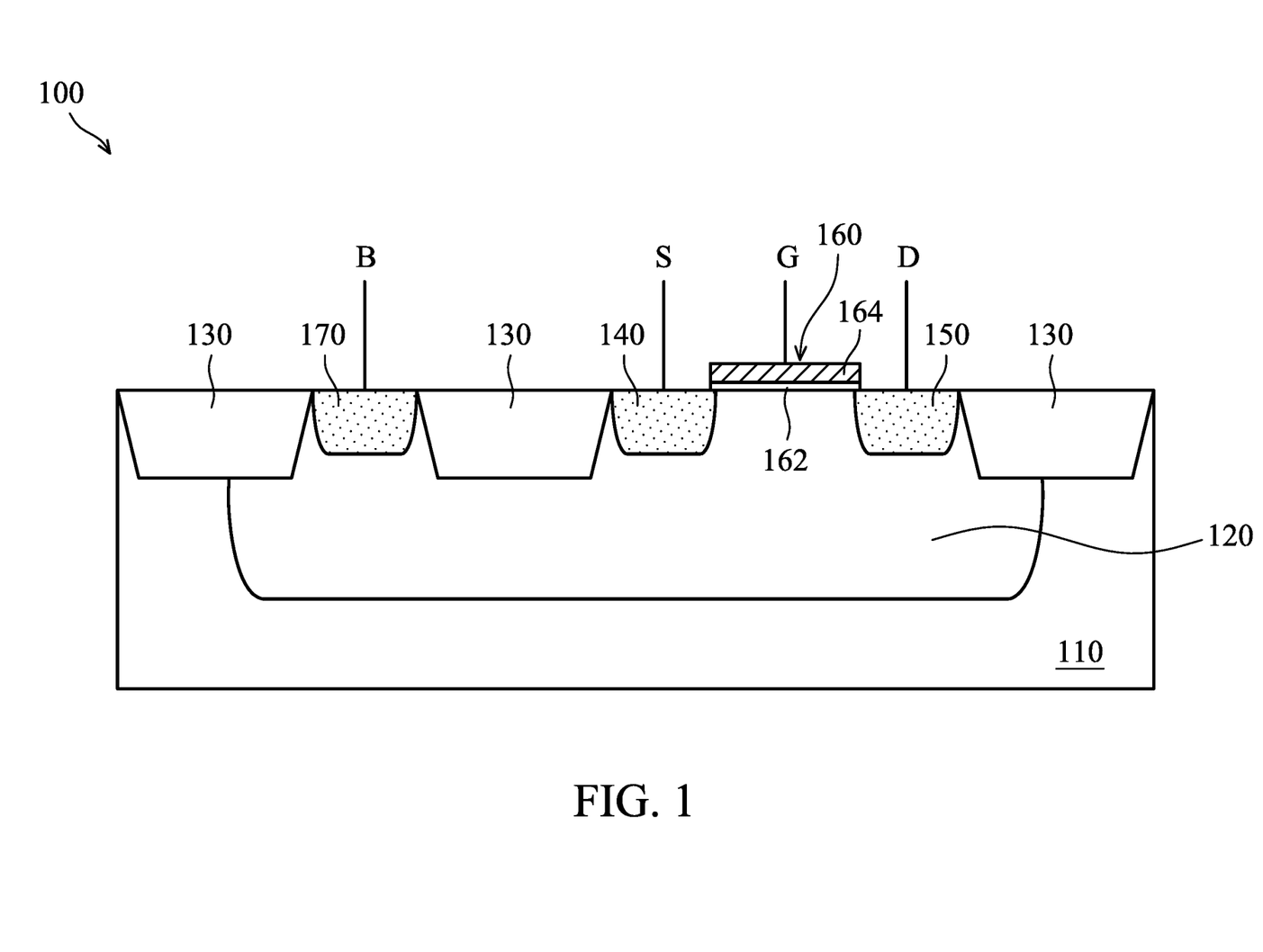
FIG. 1 is a cross-sectional view of a semiconductor device structure in accordance with some embodiments.

Refer to FIG. 1, which illustrates a cross-sectional view of a semiconductor device structure 100 in accordance with some embodiments. As shown in FIG. 1, the semiconductor device structure 100 includes a semiconductor substrate 110. The semiconductor substrate 110 may be a bulk semiconductor, a semiconductor-on-insulator (SOI) substrate, or the like, which may be doped (e.g., with a p-type or an n-type dopant) or undoped. The semiconductor substrate 110 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as a multi-layered or gradient substrate may also be used. In some embodiments, the semiconductor material of the semiconductor substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the semiconductor substrate 110 has a first conductive type, such as P type.

In addition, the semiconductor device structure 100 may include an epitaxial layer (not shown) disposed on the semiconductor substrate 110. The epitaxial layer may include, but is not limited to, Si, Ge, SiGe, III-V compound, or a combination thereof. The epitaxial layer may be formed by an epitaxial growth step, such as metal-organic chemical vapor deposition (MOCVD), metal-organic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments, the epitaxial layer has the first conductive type, such as P type.

As shown in FIG. 1, the semiconductor device structure 100 includes a well region 120 formed within the semiconductor substrate 110. Alternatively, the well region 120 can be formed within the epitaxial layer mentioned above. In some embodiments, the well region 120 has the first conductive type, such as P type. The dopant concentration of the well region 120 is between about $10^{12}$ atoms/cm$^3$ to about $10^{17}$ atoms/cm$^3$.

As shown in FIG. 1, the semiconductor device structure 100 includes a plurality of isolation regions 130. In some embodiments, the isolation region 130 is a shallow trench isolation (STI). The semiconductor substrate 110 can be patterned by a photolithography and an etching process to form multiple openings, and then dielectric material can fill into the openings by a deposition process, thereby forming the STI. In some embodiments, the isolation region 130 is a field oxide regions formed by oxidation of silicon. The photolithography process includes photoresist coating (e.g., spin-on coating), soft baking, mask alignment, exposure, post-exposure baking, developing the photoresist, rinsing and drying (e.g., hard baking). The photolithography process may also be implemented or replaced by another proper method such as maskless photolithography, electron-beam writing or ion-beam writing. The etching process may include dry etching, wet etching, and other etching methods such as reactive ion etching (RIE). Furthermore, the etching process may also include purely chemical etching (plasma etching), purely physical etching (ion milling), or a combination thereof. The deposition process may include chemical vapor deposition (CVD), physical vapor deposition (PVD), atomic layer deposition (ALD) and other deposition process.

As shown in FIG. 1, the semiconductor device structure 100 includes a source doped region 140, a drain doped region 150 and a gate 160. The source doped region 140 and the drain doped region 150 are located on two opposite sides of the gate 160. In some embodiments, the source doped region 140 and the drain doped region 150 have a second conductive type, such as N type, different than the first conductive type. The dopant concentration of the source doped region 140 and/or the drain doped region 150 is between about $10^{19}$ atoms/cm$^3$ to about $10^{21}$ atoms/cm$^3$. The source doped region 140 and the drain doped region 150 may be formed by an ion implantation process or a diffusion process followed by a rapid thermal annealing (RTA) to activate the implanted dopants.

As shown in FIG. 1, the gate 160 includes a gate dielectric layer 162 and a gate electrode 164. The material of the gate dielectric layer 162 may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, Ta$_2$O$_5$, Y$_2$O$_3$, SrTiO$_3$(STO), BaTiO$_3$(BTO), BaZrO, HfO$_2$, HfO$_3$, HfZrO, HfLaO, HfSiO, HfSiON, LaSiO, AlSiO, HfTaO, HfTiO, HfTaTiO, HfAlON, (Ba,Sr)TiO$_3$ (BST), Al$_2$O$_3$, any other suitable high-k dielectric material, or a combination thereof. The gate dielectric layer 162 may be formed by CVD or spin-on coating. The CVD may include, but is not limited to, low pressure chemical vapor deposition (LPCVD), low temperature chemical vapor deposition (LTCVD), rapid thermal chemical vapor deposition (RTCVD), PECVD, or any other suitable method.

The material of the gate electrode 164 may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by CVD, sputtering, resistive thermal evaporation, electron beam evaporation, or any other suitable method.

In some embodiments, the semiconductor device structure 100 includes a body region 170. The body region 170 has a first conductive type. The dopant concentration of the body region 170 is between about $10^{19}$ atoms/cm$^3$ to about $10^{21}$ atoms/cm$^3$. As shown in FIG. 1, the source doped region 140 is separated from the body region 170 by the isolation region 130. In addition, the drain doped region 150, the source doped region 140, the gate 160 and the body region 170 can be connected to outer voltage D, S, G and B, respectively; however, the scope of the disclosure is not intended to be limited.

Figure 2A:
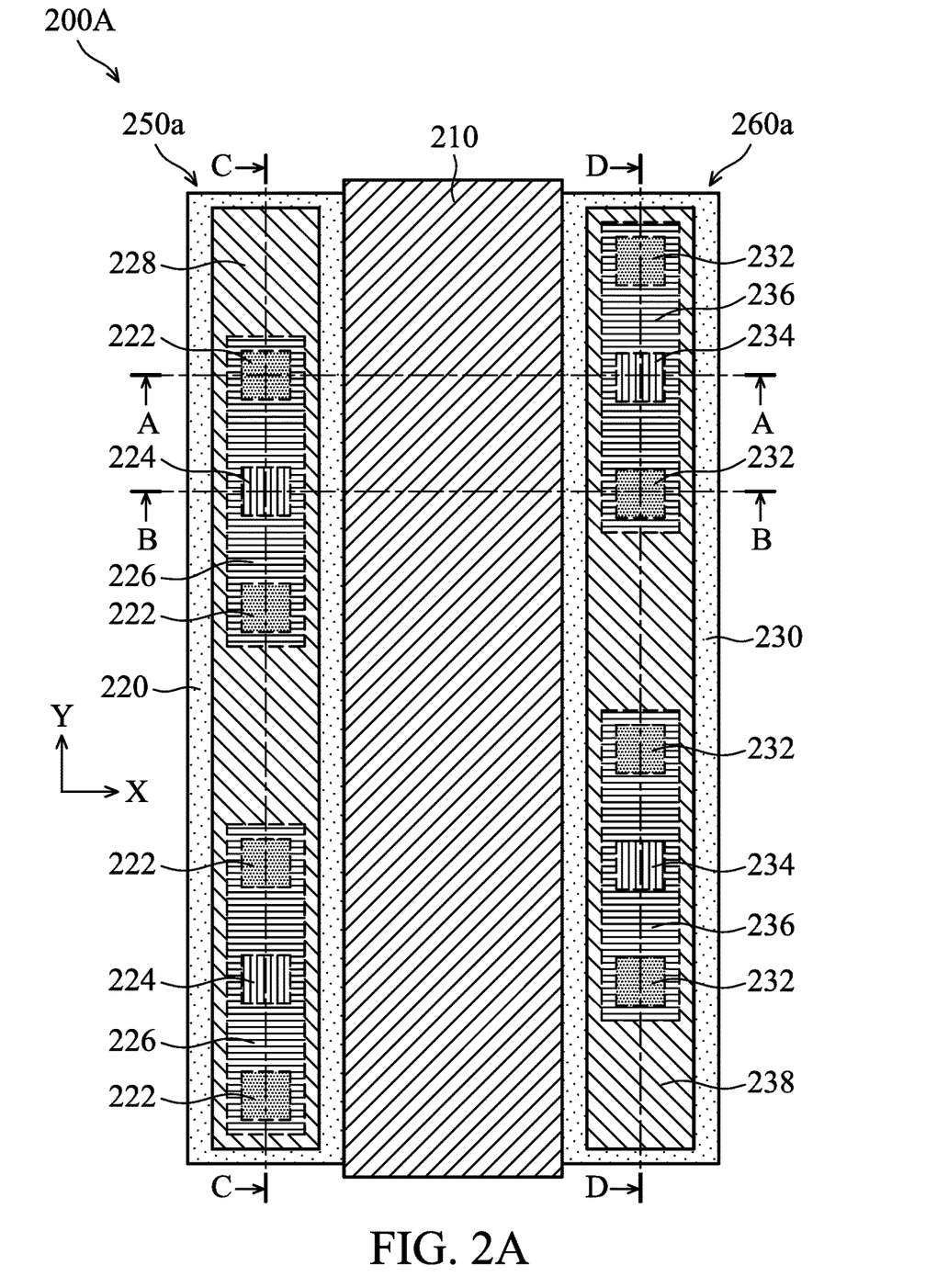
FIG. 2A is a top view of a layout of a semiconductor device structure in accordance with some embodiments.

Refer to FIG. 2A, which illustrates a top view of a layout of a semiconductor device structure 200A in accordance with some embodiments. It should be noted that in order to illustrate clearly the layout of conductive elements, doped regions and conductive holes of the source/drain region, some elements are omitted in FIG. 2.

As shown in FIG. 2A, the semiconductor device structure 200A includes a gate 210, a source doped region 220 and a drain doped region 230 that can correspond to the gate 160, the source doped region 140 and the drain doped region 150 respectively, and are not repeated herein. The gate 210, the source doped region 220 and the drain doped region 230 extend along the first direction, such as Y direction. More specifically, the longer side of the gate 210, the source doped region 220 and/or the drain doped region 230 is substantially parallel to the first direction. In addition, the semiconductor device structure 200A may include multiple gates 210, source doped regions 220 and/or drain doped regions 230 that are arranged along the second direction, such as the X direction. The semiconductor device structure 200A may also include a body region (not shown), which encloses the previously described multiple gates 210, source doped regions 220 and drain doped regions 230. Moreover, some isolation regions (not shown) are formed to electrically isolate different active elements.

Figure 2B:
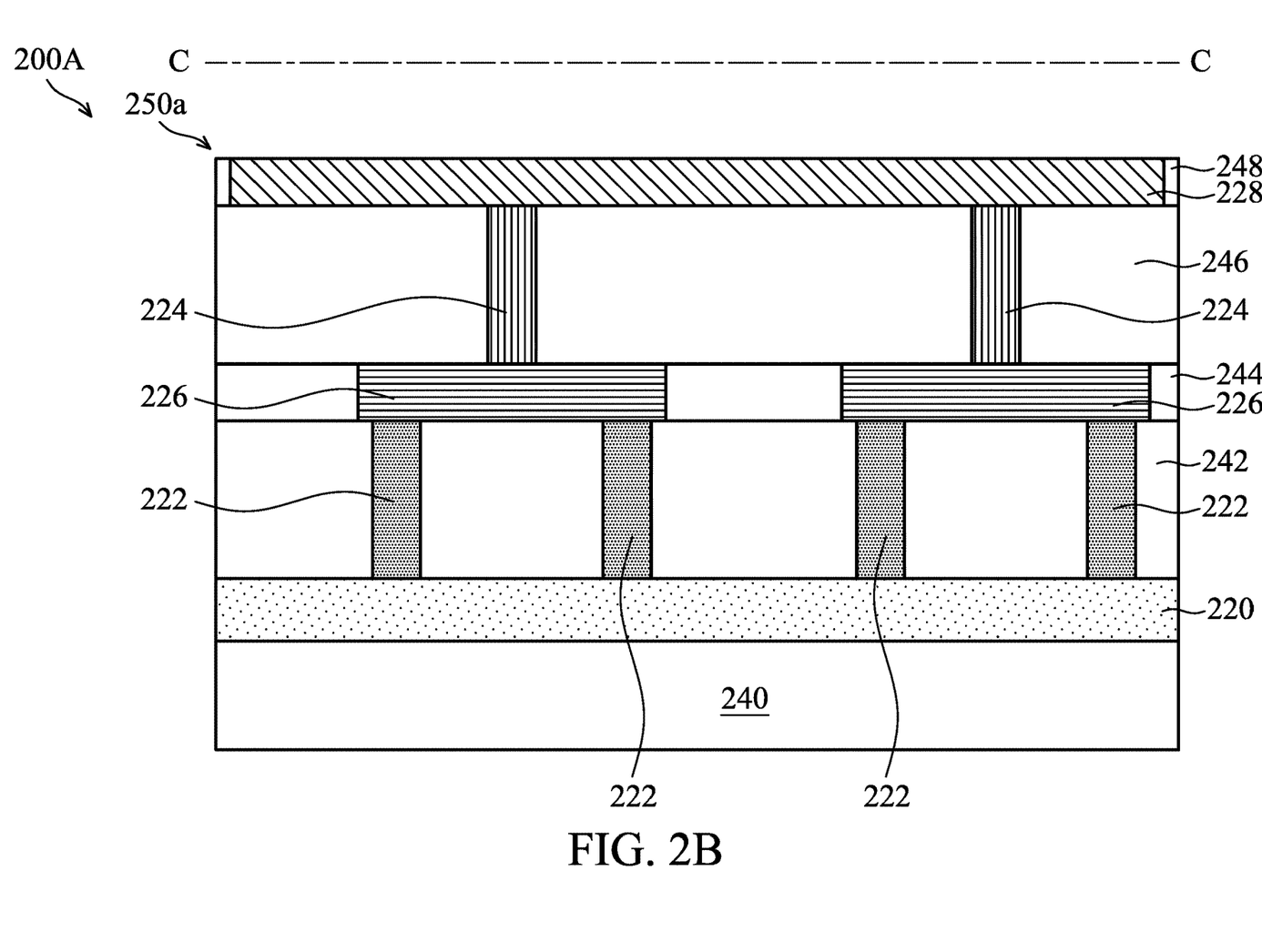
FIGS. 2B, 2C, 2D and 2E are side perspective views of the semiconductor device structure shown in FIG. 2A in accordance with some embodiments.

Next, as shown in FIG. 2A, the semiconductor device structure 200A includes a source protective circuit 250a and a drain protective circuit 260a. Refer to FIG. 2B, which illustrates a side perspective view along C-C line of the semiconductor device structure 200A shown in FIG. 2A. The semiconductor device structure 200A includes a semiconductor substrate 240 that is the same as or similar to the semiconductor substrate 110, and is not repeated herein. As shown in FIG. 2B, the semiconductor device structure 200A includes interlayer dielectric (ILD) 242, 244, 246 and 248 on the semiconductor substrate 240. In some embodiments, the ILD 242, 244, 246 and 248 are flowable films formed by FCVD. In some embodiments, the ILD 242, 244, 246 and 248 are formed by dielectric materials, such as phospho-silicate glass (PSG), boro-silicate glass (BSG), boron-doped phospho-silicate glass (BPSG), undoped silicate glass (USG), or the similar materials; the ILD 242, 244, 246 and 248 may be deposited by suitable process, such as CVD, spin coating, PECVD or a combination thereof.

In some embodiments, as shown in FIGS. 2A and 2B, the source protective circuit 250a includes a plurality of source contact windows 222, source conductive holes 224 and first source conductive elements 226. In addition, the semiconductor device structure 200 may include a silicide layer (not shown), which is formed between the source doped region 220 and the source contact window 222. In some embodiments, a metal material may be deposited on the semiconductor substrate 240 followed by performing an annealing process. Next, the metal material reacts with the surface of the semiconductor substrate 240 so that the silicide layer can be formed on the surface of the semiconductor substrate 240. After the silicide layer is formed, remaining metal material not reacting with the semiconductor substrate 240 is removed. The remaining metal material can be removed by an etching process, such as wet etching process, dry etching process, another suitable etching process, or a combination thereof.

In some embodiments, the source contact windows 222 are disposed on the semiconductor substrate 240. The source contact windows 222 are electrically connected to the source doped region 220. The source contact window 222 may include a barrier layer and a conductive layer. The barrier layer may include titanium, titanium nitride, tantalum, tantalum nitride or the like. The material of the conductive layer may include copper, copper alloy, silver, gold, tungsten, aluminum, nickel, cobalt or the like.

As shown in FIG. 2B, the first source conductive element 226 are disposed on the source contact window 222 and in contact with the source contact window 222. The first source conductive elements 226 are electrically connected to the source doped region 220. The first source conductive element 226 may include metal material, such as copper, titanium, cobalt, tungsten, nickel. In addition, the first source conductive element 226 may also include a barrier layer. The first source conductive element 226 may be formed by PVD, CVD, spin coating, other suitable process or a combination thereof. In some embodiments, as shown in FIGS. 2A and 2B, the first source conductive element 226 extends in the first direction, such as Y-direction. More specifically, the longer side of the first source conductive element 226 is substantially parallel to the first direction. In some embodiments, one first source conductive element 226 is in physical contact with at least two source contact windows 222.

As shown in FIG. 2B, the source conductive holes 224 are disposed on the first source conductive element 226, and in physical contact with the source doped region 220. The source conductive hole 224 may be made of a material that is the same or similar to that of the source contact window 222, and it is not repeated herein. As shown in FIG. 2A, the source conductive hole 224 does not overlap the source contact window 222 from a top view. More specifically, the region where the source conductive hole 224 projects onto the semiconductor substrate 240 does not overlap the region where the source contact window 222 projects onto the semiconductor substrate 240. In this embodiment, one first source conductive element 226 is in physical contact with two source contact windows 222 and one source conductive hole 224.

As shown in FIGS. 2A and 2B, the source protective circuit 250a further includes a second source conductive element 228 disposed on the source conductive hole 224. The second source conductive element 228 may be made of a material that is the same or similar to that of the first source conductive element 226, and it is not repeated herein. In some embodiments, the second source conductive element 228 extends in the first direction. More specifically, the longer direction of the second source conductive element 228 is substantially parallel to the first direction. In some embodiments, one second source conductive element 228 covers multiple first source conductive elements 226.

Figure 2C:
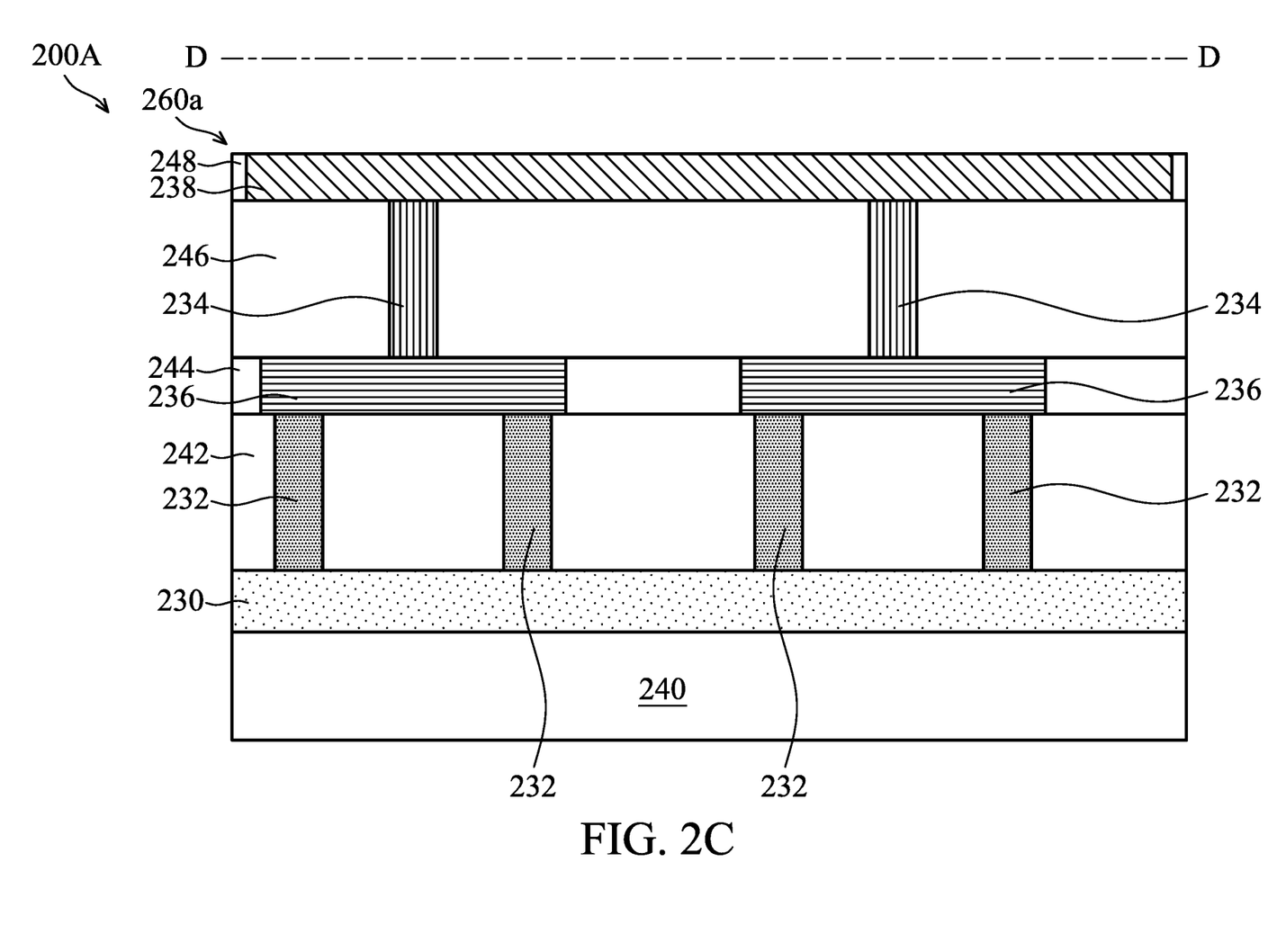

Refer to FIG. 2C, which illustrates a cross-sectional view of the semiconductor device structure 200A along D-D line. In some embodiments, as shown in FIGS. 2A and 2C, the semiconductor device structure 200A includes a plurality of drain contact windows 232, drain conductive holes 234 and first drain conductive elements 236. Further, the semiconductor device structure 200A includes a silicide layer (not shown) formed between the drain doped region 230 and the drain contact window 232.

In some embodiments, the drain contact windows 232 are disposed on the semiconductor substrate 240. The drain contact windows 232 are electrically connected to the drain doped region 230. The drain contact window 232 may include a barrier layer and a conductive layer. The barrier layer may include titanium, titanium nitride, tantalum, tantalum nitride or the like. The material of the conductive layer may include copper, copper alloy, silver, gold, tungsten, aluminum, nickel, cobalt or the like.

As shown in FIG. 2C, the first drain conductive element 236 are disposed on the drain contact window 232 and in contact with the drain contact window 232. The first drain conductive elements 236 are electrically connected to the drain doped region 230. The first drain conductive element 236 may include metal material, such as copper, titanium, cobalt, tungsten, nickel. In addition, the first drain conductive element 236 may also include a barrier layer. The first drain conductive element 236 may be formed by PVD, CVD, spin coating, other suitable process or a combination thereof. In some embodiments, as shown in FIGS. 2A and 2C, the first drain conductive element 236 extends in the first direction. More specifically, the longer side of the first drain conductive element 236 is substantially parallel to the first direction. In some embodiments, one first drain conductive element 236 is in physical contact with at least two drain contact windows 232.

As shown in FIG. 2C, the drain conductive holes 234 are disposed on the first drain conductive elements 236, and in physical contact with the drain doped region 230. The drain conductive hole 234 may be made of a material that is the same or similar to that of the drain contact window 232, and it is not repeated herein. As shown in FIG. 2A, the drain conductive hole 234 does not overlap the drain contact window 232 from the top view. More specifically, the region where the drain conductive hole 234 projects onto the semiconductor substrate 240 does not overlap the region where the drain contact window 232 projects onto the semiconductor substrate 240. In this embodiment, one first drain conductive element 236 is in physical contact with two drain contact windows 232 and one drain conductive hole 234.

As shown in FIGS. 2A and 2C, the second drain conductive element 238 is disposed on the drain conductive hole 234. The second drain conductive element 238 may be made of a material that is the same or similar to that of the first drain conductive element 236, and it is not repeated herein. In some embodiments, the second drain conductive element 238 extends in the first direction. More specifically, the longer direction of the second drain conductive element 238 is substantially parallel to the first direction. In some embodiments, one second drain conductive element 238 covers multiple first drain conductive elements 236.

In some embodiments, the first source conductive element 226 of the source protective circuit 250a does not extend to the region directly over the drain doped region 230. Namely, the region where the first source conductive element 226 projects onto the surface of the semiconductor substrate 240 does not overlap the drain doped region 230. The first drain conductive element 236 of the drain protective circuit 260a does not extend to the region directly over the source doped region 220. Namely, the region where the first drain conductive element 236 projects onto the surface of the semiconductor substrate 240 does not overlap the source doped region 220. The layout mentioned above may assist in simplifying the process and improving the yield of the semiconductor device structure 200A.

In some embodiments, as shown in FIG. 2A, the source contact windows 222 of the source protective circuit 250a are not aligned with the drain contact windows 232 of the drain protective circuit 260a. More specifically, the arrangement of the source contact windows 222 offsets the arrangement of the drain contact windows 232. An imaginary line extending in the second direction would not pass through the source contact window 222 and the drain contact window 232 simultaneously.

In some embodiments, the source conductive holes 224 of the source protective circuit 250*a* are not aligned with the drain conductive holes 234 of the drain protective circuit 260*a*. More specifically, the arrangement of the source conductive holes 224 offsets the arrangement of the drain conductive holes 234. An imaginary line along the second direction would not pass through the source conductive hole 224 and the drain conductive hole 234 simultaneously.

In some embodiments, the first source conductive element 226 of the source protective circuit 250*a* is not aligned with the first drain conductive element 236 of the drain protective circuit 260*a*. For example, there is a distance between the shorter side of the first source conductive element 226 and the shorter side of the first drain conductive element 236 along the first direction. More specifically, the shorter side of the first source conductive element 226 is not aligned with the shorter side of the first drain conductive element 236. In some embodiments, the second source conductive element 228 of the source protective circuit 250*a* is aligned with the second drain conductive element 238 of the drain protective circuit 260*a*. For example, the shorter side of the second source conductive element 228 is aligned with the shorter side of the second drain conductive element 238. In addition, the first source conductive element 226 is separated from the first drain conductive element 236; the first source conductive element 226 is not electrically connected to the first drain conductive element 236. The second source conductive element 228 is separated from the second drain conductive element 238; the second source conductive element 228 is not electrically connected to the second drain conductive element 238.

Figure 2D:
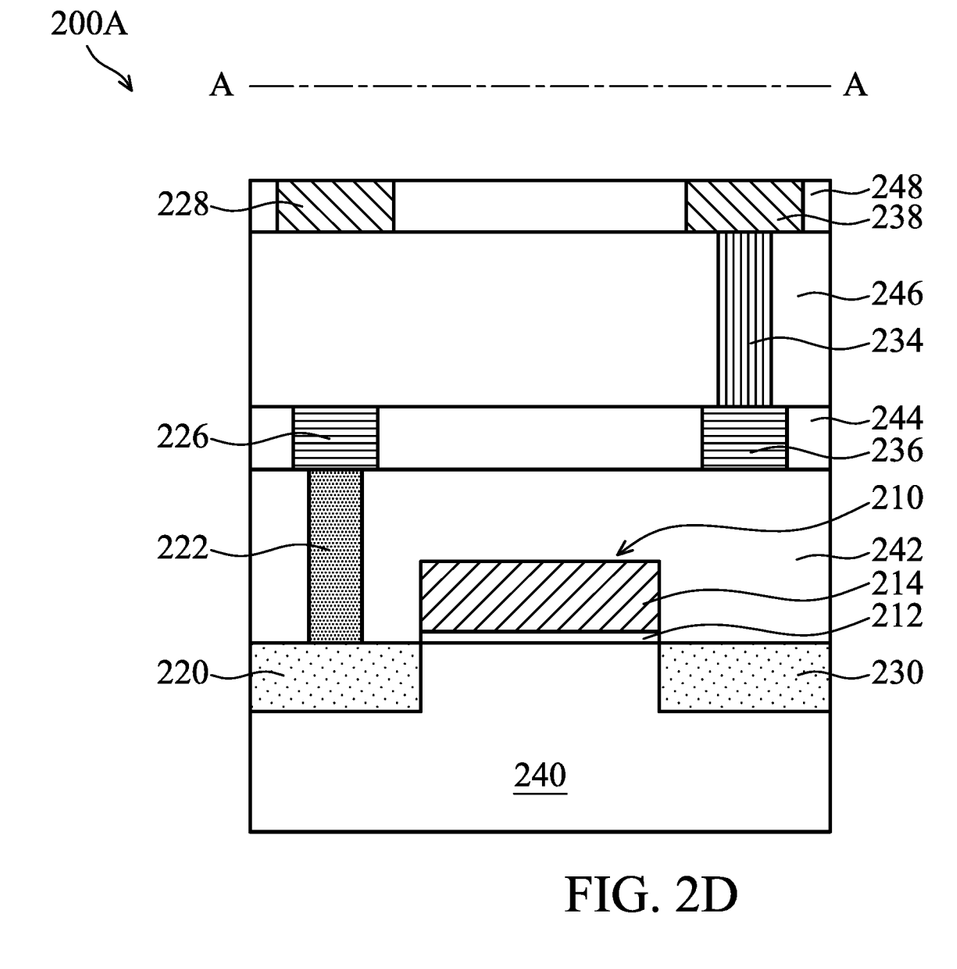

Refer to FIG. 2D, which illustrates a cross-sectional view of the semiconductor device structure 200A along A-A line. In some embodiments, as shown in FIG. 2D, the source doped region 220 and the drain doped region 230 are located on two sides of the gate 210. The gate 210 includes a gate dielectric layer 212 and a gate electrode 214 that may be the same as or similar to the gate dielectric layer 162 and the gate electrode 164 respectively, and are not repeated herein. In some embodiments, in a cross-sectional plane having the source contact window 222, there is no drain contact window 232 formed over the drain doped region 230. In some embodiments, in a cross-sectional plane having the drain conductive hole 234, there is no source conductive hole 224 formed over the first source conductive element 226. In some embodiments, the source contact window 222 and the drain conductive hole 234 are located in the same cross-sectional plane.

Moreover, as shown in FIG. 2D, the first source conductive element 226 and the first drain conductive element 236 are located in the same horizontal layer. More specifically, the first source conductive element 226 and the first drain conductive element 236 are disposed on the ILD 242. The second source conductive element 228 and the second drain conductive element 238 are located in the same horizontal layer. More specifically, the second source conductive element 228 and the second drain conductive element 238 are disposed on the ILD 246.

Figure 2E:
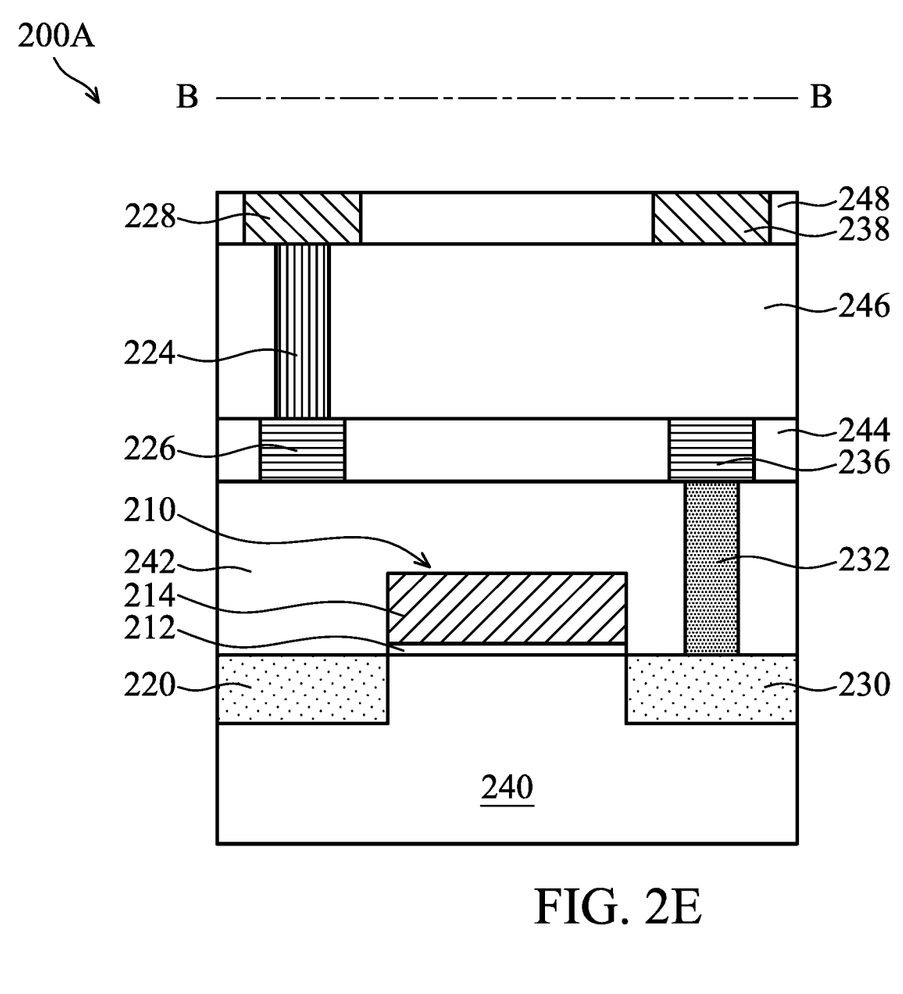

Refer to FIG. 2E, which illustrates a cross-sectional view of the semiconductor device structure 200A along B-B line. In some embodiments, in a cross-sectional plane having the drain contact window 232, there is no source contact window 222 formed over the source doped region 220. In some embodiments, in a cross-sectional plane having the source conductive hole 224, there is no drain conductive hole 234 formed over the first drain conductive element 236. In some embodiments, the drain contact window 232 and the source conductive hole 224 are located in the same cross-sectional plane.

Figure 3:
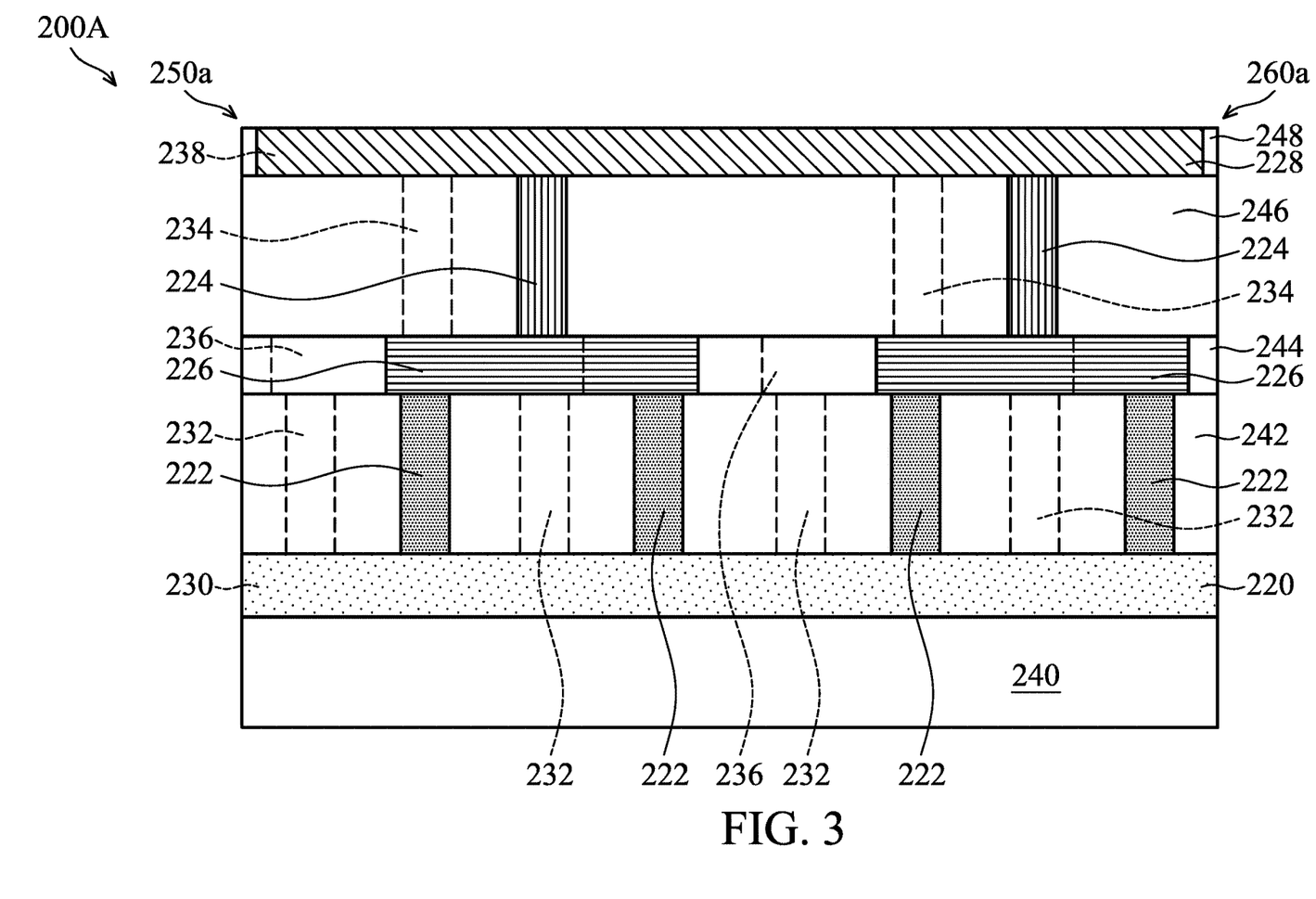
FIG. 3 is a side perspective view of the semiconductor device structure shown in FIG. 2A in accordance with some embodiments.

Refer to FIG. 3, which illustrates the side perspective view of the semiconductor device structure 200A shown in FIG. 2A in accordance with some embodiments of the disclosure. More specifically, FIG. 3 is the figure that the cross-sectional view of FIG. 2B overlapped that of FIG. 2C. It should be noted that the elements of FIG. 2B are illustrated as a solid line, and the elements of FIG. 2C are illustrated as a dashed line. As shown in FIG. 3, the source contact window 222 does not overlap the drain contact window 232; the source conductive hole 224 does not overlap the drain conductive hole 234. In some embodiments, the first source conductive element 226 overlaps a portion of the first drain conductive element 236. In some embodiments, the first source conductive element 226 does not completely overlap the first drain conductive element 236; the source conductive hole 224 and/or the drain conductive hole 234 is disposed within these overlapping regions.

Figure 4A:
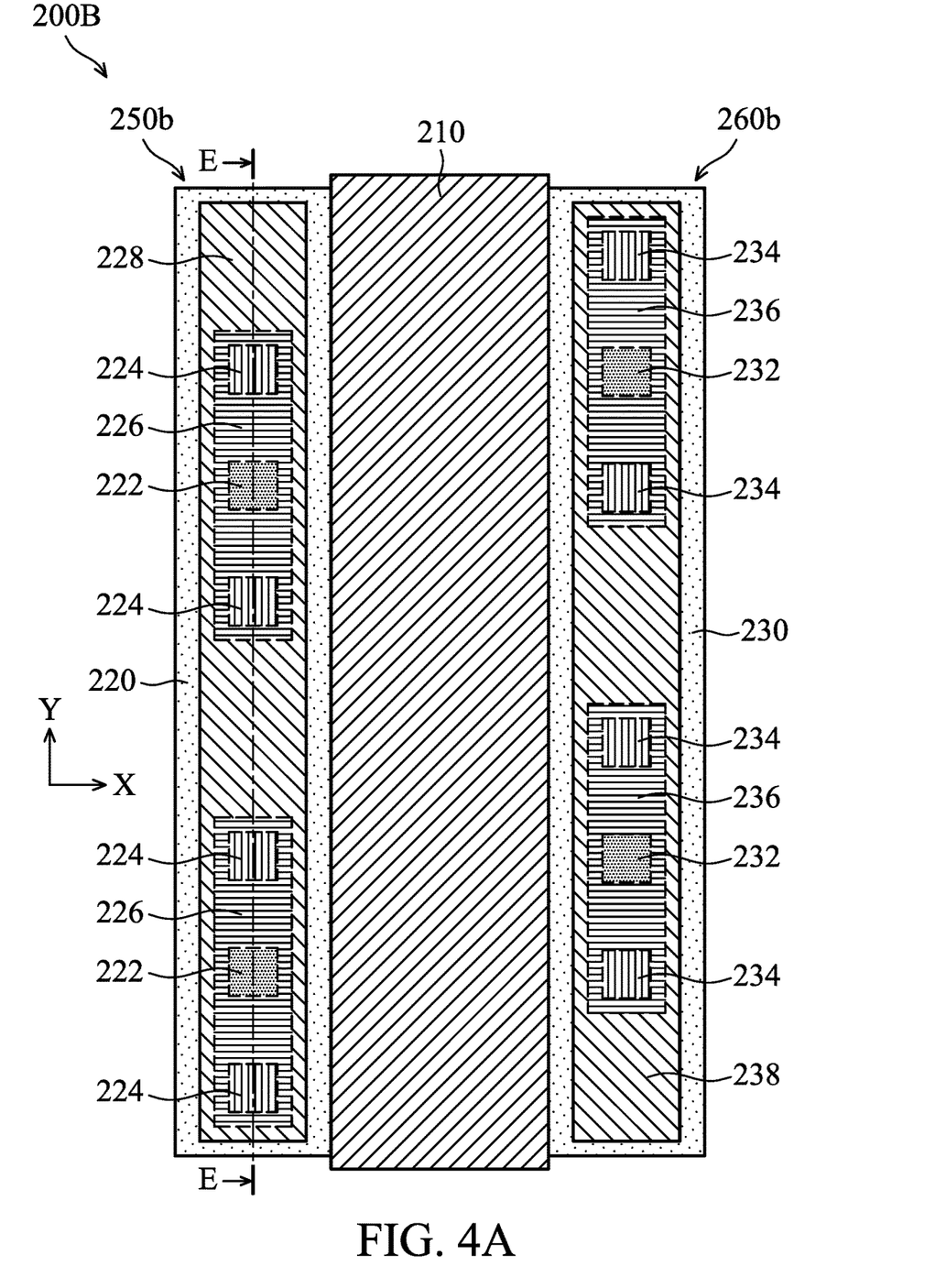
FIG. 4A is a top view of a layout of a semiconductor device structure in accordance with some embodiments.
Figure 4B:
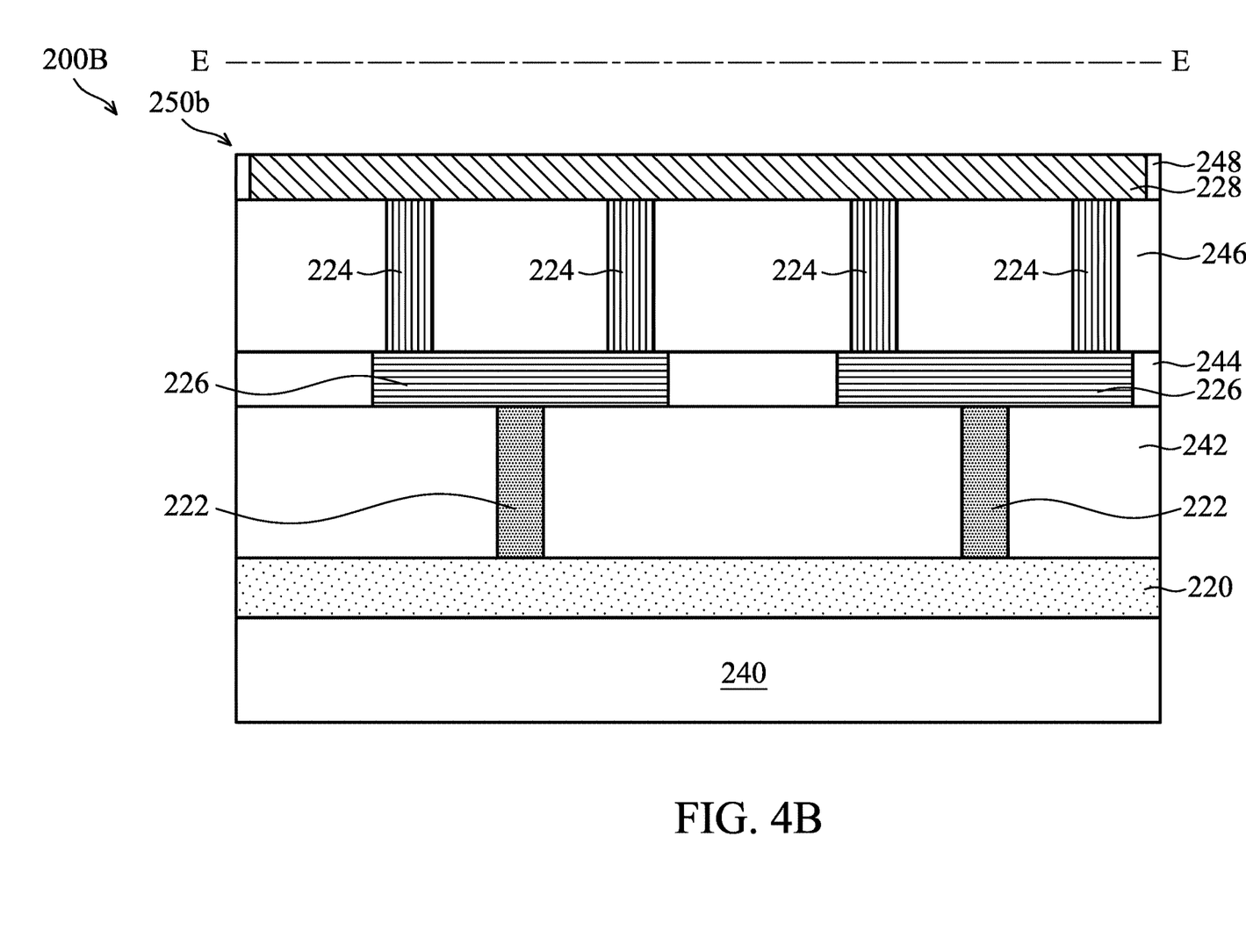
FIG. 4B is a side perspective view of the semiconductor device structure shown in FIG. 4A in accordance with some embodiments.

Many variations and/or modifications can be made to embodiments of the disclosure. In some embodiments, the layout of the protective circuits has other patterns. Refer to FIGS. 4A and 4B, which illustrate a top view of the layout and a cross-sectional view of the semiconductor device structure 200B along E-E line, respectively. As shown in FIG. 4A, the semiconductor device structure 200B includes a source protective circuit 250*b* and a drain protective circuit 260*b*. The source protective circuit 250*b* includes the source contact window 222, source conductive hole 224, first source conductive element 226 and second source conductive element 228; the drain protective circuit 260*b* includes the drain contact window 232, drain conductive hole 234, first drain conductive element 236 and second drain conductive element 238. In some embodiments, one first source conductive element 226 of the source protective circuit 250*b* is in contact with one source contact window 222 and two source conductive holes 224. In some embodiments, one first drain conductive element 236 of the drain protective circuit 260*b* is in contact with one drain contact window 232 and two drain conductive holes 234.

Figure 5A:
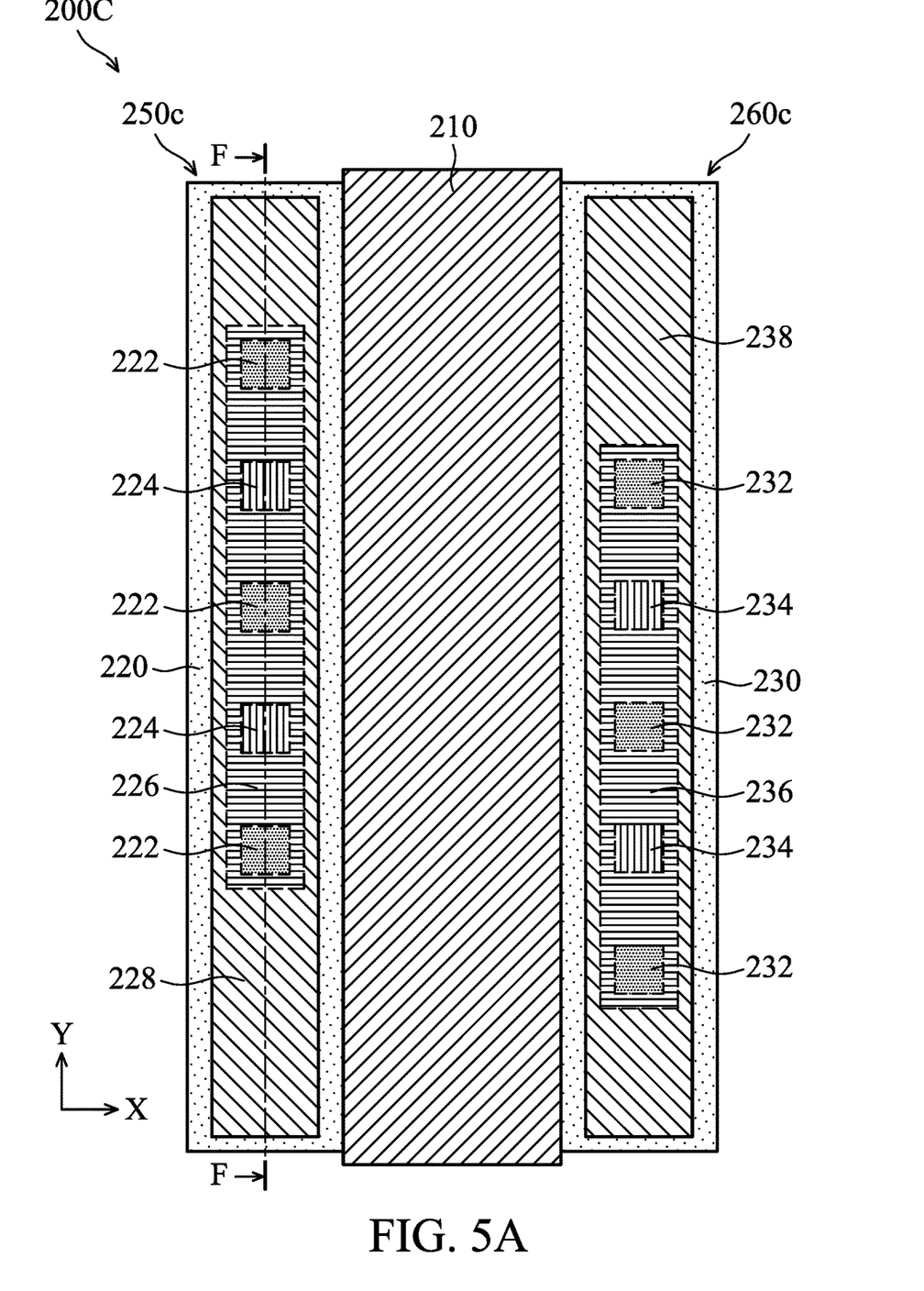
FIG. 5A is a top view of a layout of a semiconductor device structure in accordance with some embodiments.
Figure 5B:
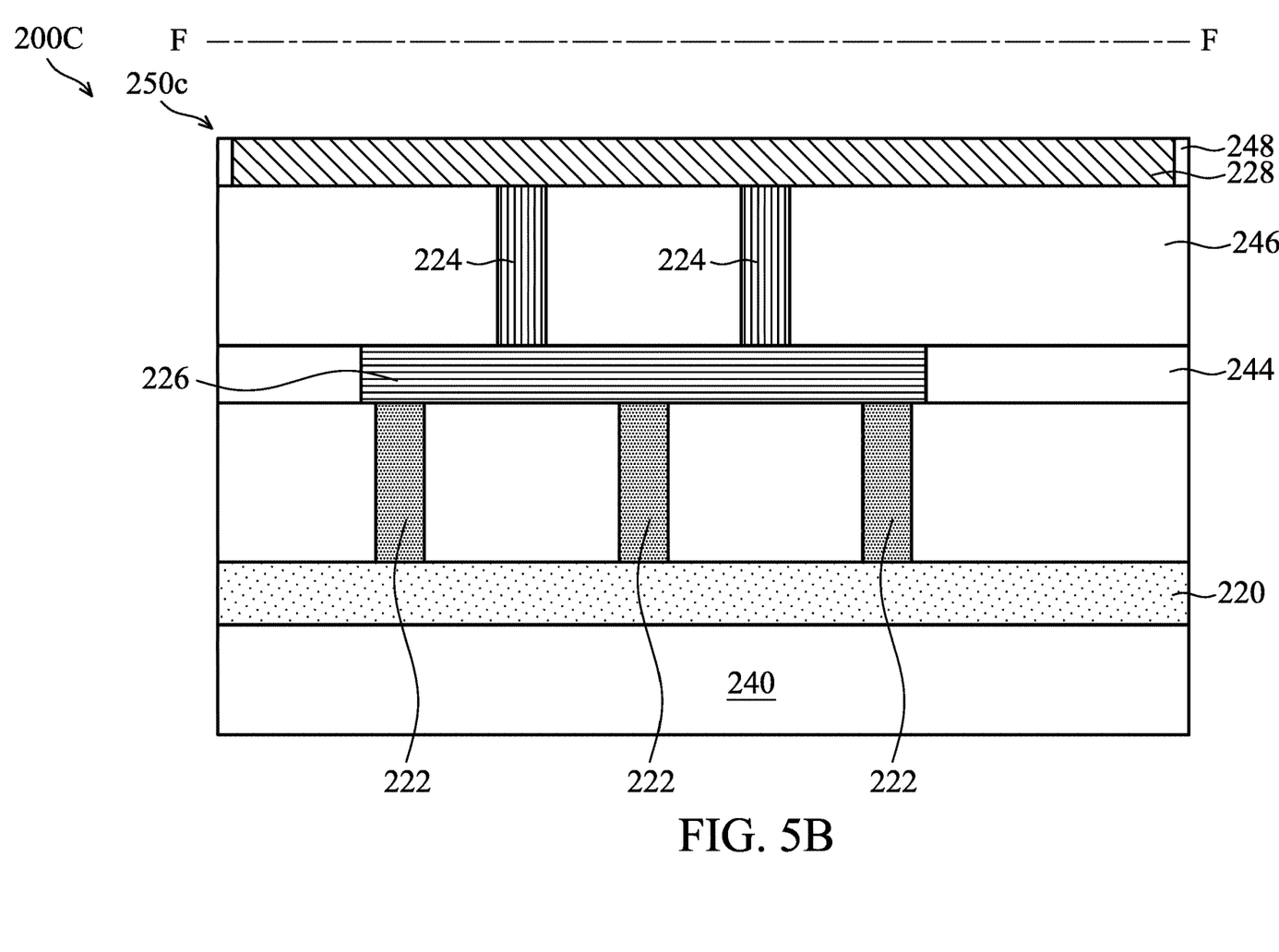
FIG. 5B is a side perspective view of the semiconductor device structure shown in FIG. 5A in accordance with some embodiments.

Many variations and/or modifications can be made to embodiments of the disclosure. Refer to FIGS. 5A and 5B, which illustrate a top view of the layout and a cross-sectional view of the semiconductor device structure 200C along F-F line, respectively. As shown in FIG. 5A, the semiconductor device structure 200C includes a source protective circuit 250*c* and a drain protective circuit 260*c*. The source protective circuit 250*c* includes the source contact window 222, source conductive hole 224, first source conductive element 226 and second source conductive element 228; the drain protective circuit 260*c* includes the drain contact window 232, drain conductive hole 234, first drain conductive element 236 and second drain conductive element 238. In some embodiments, one first source conductive element 226 of the source protective circuit 250*c* is in contact with three source contact window 222 and two source conductive holes 224. In some embodiments, one first drain conductive element 236 of the drain protective circuit 260*c* is in contact with three drain contact window 232 and two drain conductive holes 234. In some embodiments, the number of source contact windows 222 in physical contact with the first source conductive element 226 is different than the number of source conductive holes 224 in physical contact with the first source conductive element 226. In some embodiments, the number of drain contact windows 232 in physical contact with the first drain conductive element 236 is different than the number of drain conductive holes 234 in physical contact with the first drain conductive element 236.

It should be noted that the number of source conductive elements in physical contact with the source contact window or the source conductive hole, or the number of drain conductive elements in physical contact with the drain contact window or the drain conductive hole, shown in above figures, is merely exemplary. In other embodiments, the number can be modified. In addition, the first source conductive element 226 and the first drain conductive element 236 can also be referred to as the first metal layer; the second source conductive element 228 and the second drain conductive element 238 can also be referred to as the second metal layer.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
    a semiconductor substrate;
    a gate disposed on the semiconductor substrate and extending in a first direction;
    a source doped region disposed in the semiconductor substrate and extending in the first direction;
    a drain doped region disposed in the semiconductor substrate and extending in the first direction, wherein the source doped region and the drain doped region are located on two opposite sides of the gate;
    a plurality of source contact windows disposed on the source doped region and extending in the first direction;
    a plurality of drain contact windows disposed on the drain doped region and extending in the first direction, wherein the drain contact windows and the source contact windows are in different rows from a top view;
    a plurality of source conductive holes disposed on the source doped region;
    a plurality of drain conductive holes disposed on the drain doped region, wherein the source conductive holes and the drain conductive holes are in different rows from the top view, wherein the source contact windows and the source conductive holes are alternately disposed along the first direction from the top view; and
    a first source conductive element disposed on the source contact windows, wherein the first source conductive element is electrically connected to the source doped region and extends in the first direction.

2. The semiconductor device structure as claimed in claim 1, further comprising:
    a first drain conductive element disposed on the drain contact windows, wherein the first drain conductive element is electrically connected to the drain doped region and extends in the first direction.

3. The semiconductor device structure as claimed in claim 2, wherein from a side perspective view, the first drain conductive element partially overlaps the first source conductive elements.

4. The semiconductor device structure as claimed in claim 2, wherein the first drain conductive element offsets the first source conductive element.

5. The semiconductor device structure as claimed in claim 1, wherein the first source conductive element is in physical contact with at least two source contact windows.

6. The semiconductor device structure as claimed in claim 1, wherein the source conductive holes offset the source conductive windows.

7. The semiconductor device structure as claimed in claim 1, wherein the first source conductive element is in physical contact with at least two source conductive holes.

8. The semiconductor device structure as claimed in claim 1, further comprising:
    a second source conductive element covering the first source conductive element and extending in the first direction.

* * * * *